United States Patent [19]

Capra et al.

[11] Patent Number: 4,711,694

[45] Date of Patent: Dec. 8, 1987

[54] PROCESS FOR PRODUCING A LAYER HAVING A HIGH MAGNETIC ANISOTROPY IN A FERRIMAGNETIC GARNET

[75] Inventors: Thierry Capra, Lyons; Philippe Gerard, St. Ismier, both of France

[73] Assignee: Commissariat a l'Energie Atomique, Paris, France

[21] Appl. No.: 792,202

[22] Filed: Oct. 28, 1985

[30] Foreign Application Priority Data

Nov. 12, 1984 [FR] France ................................ 84 17200

[51] Int. Cl.[4] ......................... C30B 1/02; C30B 19/00; G11C 19/08; B05D 3/06

[52] U.S. Cl. .................................... 156/603; 156/605; 156/610; 156/DIG. 73; 156/DIG. 74; 365/36; 427/38; 427/130

[58] Field of Search ............... 156/605, 606, 610, 621, 156/DIG. 73, DIG. 74; 427/130, 38; 148/DIG. 3, DIG. 4, 121; 365/36, 178

[56] References Cited

U.S. PATENT DOCUMENTS

| | | | |
|---|---|---|---|
| 3,759,745 | 9/1973 | Dixon et al. | 427/130 |
| 4,451,500 | 5/1984 | Gerard et al. | 427/130 |
| 4,476,152 | 10/1984 | Imura et al. | 365/36 |
| 4,568,561 | 2/1986 | Betsui et al. | 365/36 |
| 4,578,651 | 3/1986 | Heitmann et al. | 365/36 |

FOREIGN PATENT DOCUMENTS

| | | | |
|---|---|---|---|
| 0215004 | 12/1983 | Japan | 156/605 |
| 0018910 | 1/1985 | Japan | 365/36 |
| 0145592 | 8/1985 | Japan | 365/36 |
| 2100079 | 12/1982 | United Kingdom . | |

OTHER PUBLICATIONS

Davies, J., "Control of Magnetic Properties During Processing of Single Crystal Garnet Films", IBM J. Res. Develop., Nov. 1977, pp. 522-526, vol. 21, No. 6.

*Journal of Applied Physics,* vol. 43, No. 6, Jun. 1972, pp. 2883-2885; A. J. Kurtzig et al, "Control of the Magnetization of Bubble Garnets by Annealing".

*Primary Examiner*—John Doll

*Assistant Examiner*—R. Bruce Breneman

*Attorney, Agent, or Firm*—Oblon, Fisher, Spivak, McClelland, & Maier

[57] ABSTRACT

Process for producing a ferrimagnetic garnet layer having a high magnetic anisotropy on an amagnetic substrate, wherein it comprises the stages of forming at least one ferrimagnetic garnet layer by epitaxy from the amagnetic substrate, high dose ion implantation in the ferrimagnetic garnet layer in order to produce defects therein and heating the entity in the presence of a reducing agent to a temperature between 250° and 450° C.

Application to the production of bubble stores with non-implanted propagation patterns.

11 Claims, No Drawings

PROCESS FOR PRODUCING A LAYER HAVING A HIGH MAGNETIC ANISOTROPY IN A FERRIMAGNETIC GARNET

BACKGROUND OF THE INVENTION

The present invention relates to a process for producing a layer having a high planar magnetic anisotropy in a ferrimagnetic garnet. It more particularly applies to the field of producing magnetic bubble stores and particularly non-implanted disk bubble stores, as well as in the field of producing magneto-optical or semi-conductor material.

In general terms, the production of a bubble store firstly consists of producing by epitaxy a ferrimagnetic garnet layer with growth anisotropy perpendicular to the layer on an a magnetic substrate, mainly a garnet. It is pointed out that magnetic bubbles are small magnetic domains, whose magnetization, directed perpendicular to the surface, is reversed compared with that of the material containing the bubbles. The ions are then implanted in the epitactic layer.

This ion implantation makes it possible to produce on the surface of the ferrimagnetic garnet layer a planar magnetization layer, i.e. a layer whose magnetization is parallel to the surface of said layer. This planar magnetization layer has the object of increasing the stability of the magnetic bubbles. This ion implantation makes it possible to produce planar magnetization layers over a thickness of approximately 0.5 $\mu$m.

By using an appropriate implanation mask, it is possible to define in the case of bubble stores with non-implanted patterns, propagation patterns, which are contiguous patterns, having the shape of a disk, lozenge, etc. As ion implantation is only carried out around these patterns, the latter are called nonimplanted patterns.

In the case of bubble stores with patterns based on iron and nickel, ion implanation, apart from serving to form the surface layer with planar magnetization, is also used for eliminating the "hard" bubbles, i.e. the bubbles having structures with complex walls.

The propagation of the magnetic bubbles along the propagation patterns is realised by applying a rotary d.c. field in a direction parallel to the surface of the ferrimagnetic layer. The bubbles positioned below the planar magnetization surface layer are bonded to non-implanted propagation patterns via a potential well due to the stress field between the implanted and non-implanted zones. The displacement of the magnetic bubbles along the propagation patterns results from the action of the rotary field, which produces a mobile charged wall entraining the bubbles.

For a considerable time use has been made of the magnetostriction properties of the ferrimagnetic garnet layers to obtain said magnetic anisotropy of the surface layer. Thus, ion bombardment produces on the surface of the epitactic garnet layer, defects which consequently lead to a deformation of the mesh parameter in the direction perpendicular to said ferrimagnetic garnet layer. Within the garnet layer, said defects produce high mechanical stresses oriented parallel to the surface of said layer. It has been proved that an expansion of the mesh parameter could not be carried out parallel to the surface of the ferrimagnetic layer.

The ferrimagnetic garnet layers are produced so as to have a negative magnetostriction coefficient. In this case, a compressive stress obtained by ion implanation induces magnetic anisotropy in the plane of the implanted surface layer which exceeds the growth anisotropy of the starting material, i.e. the non-implanted material.

Unfortunately this magnetostriction mechanism has limits depending on the size of the growth anisotropy of the material (growth by epitaxy), as well as its negative magnetostriction coefficient. Thus, it is not possible to increase the implanted ion dose indefinitely, because beyond a certain threshold of the defects, the magnetism of the implanted surface layer is cancelled out and it is no longer possible to move the bubbles along the non-implanted propagation patterns.

However, in view of the fact that new generations of magnetic bubble stores and in particular non-implanted pattern stores tend to store ever higher information densities, it is necessary for ever decreasing sizes of the magnetic bubbles, which cannot be achieved using a material with a high growth anisotropy. Unfortunately, with such materials, it is no longer possible to obtain a planar magnetization in the implanted layer by a simple magnetostriction mechanism.

In order to increase the magnetic anisotropy of the implanted layer, no matter what the growth anisotropy of the starting material, consideration has recently been given to carrying out a reverse sputtering of argon ions in said implanted layer. This is carried out by heating a sample to above 100° C. This process is described in the article entitled "Magnetic and Crystalline Properties of Ion-implanted Garnet Fibres with Plasma Exposure" by K. Betsui et al, published at the Intermag Conference, Hamburg in 1984.

SUMMARY OF THE INVENTION

The present invention relates to another process for producing a layer having a high planar magnetic anisotropy in a ferrimagnetic garnet making it possible to obviate the disadvantages referred to hereinbefore.

More specifically the present invention relates to a process for producing a ferrimagnetic garnet layer having a high planar magnetic anisotropy on an amagnetic substrate, wherein it comprises the stages of forming at least one ferrimagnetic garnet layer by epitaxy from the amagnetic substrate, high dose ion implanation in the ferrimagnetic garnet layer in order to produce defects in said layer and heating the entity in the presence of a reducing agent at a temperature between 250° and 450° C.

According to the invention, the stage of heating the complete structure in the presence of a reducing agent makes it possible to very considerably increase the magnetic anisotropy of the ferrimagnetic garnet layer. This magnetic anisotropy increase would appear to be explainable by a reduction in the surface of the implanted ferrimagnetic layer.

According to a preferred embodiment of the process according to the invention, the reducing agent is a gas and preferably hydrogen.

According to a preferred embodiment of the process according to the invention, the implanted ions are neon ions.

The process for producing a ferrimagnetic garnet layer with a high planar magnetic anisotropy according to the invention is advantageously applied to the production of a bubble store with non-implanted propagation patterns.

In such an application, the process according to the invention comprises the stages of forming a ferrimagnetic garnet layer by epitaxy from the amagnetic substrate, implanting ions in the upper part of the ferrimagnetic garnet layer in order to produce defects in said parts and form the propagation patterns and heating the entity, in the presence of a reducing agent, to a temperature between 250° and 450° C.

DETAILED DESCRIPTION OF THE INVENTION

Other features and advantages of the invention can be gathered from the following non-limitative description. This description is based on the production of non-implanted disk bubble stores, but obviously the invention has much wider applications, as stated hereinbefore.

The first stage of the process consists of forming in per se known manner by epitaxy on an amagnetic substrate, such as of gadolinium gallate ($Gd_3\,Ga_5\,O_{12}$) a ferrimagnetic garnet layer, whereof the magnetization vector is oriented perpendicularly to the surface of said layer. In said ferrimagnetic layer with a thickness of approximately 1000 nm, there can be magnetic bubbles in the presence of a polarizing field.

The ferrimagnetic garnet can be a known material in accordance with the following formula $(YSmLuCa)_3(FeGe)_5O_{12}$.

The orientation of the magnetization vectors in the ferrimagnetic garnet layer is due to a growth anisotropy of the materials, which is obtained by an appropriate choice of the epitaxy conditions, which are well known in the art.

The following stage of the process consists of effecting ion implanation in the upper ferrimagnetic layer in order to form defects in the upper part of said layer over a thickness of approximately 300 nm. This ion implanation can be carried out with different types of ions, such as hydrogen, neon, nitrogen, oxygen, argon, etc. with a high dose, without making amorphous the ferrimagnetic material constituting the implanted part of the epitactic layer, i.e. removing the magnetic properties from said material. For example, neon ion implanation can take place at a dose equal to or below $10^{15}$ atoms/cm$^2$ and at an energy of 200 keV.

Apart from producing defects in the upper part of the ferrimagnetic layer, ion implanation permits the formation in said parts, by using an appropriate mask, of non-implanted propagation patterns of magnetic bubbles.

Following said ion implanation, the complete structure undergoes heating in the presence of a reducing agent, which can be a solid, a liquid or a gas. Preference is given to the use of a gaseous reducing agent, such as hydrogen sulphide ($H_2S$), hydrogen phosphide ($PH_3$), hydrogen antimonide ($SbH_3$), hydrogen arsenide ($AsH_3$) and hydrogen, hydrogen being used with particular advantage.

Heating in the presence of the reducing agent takes place at a temperature between 250° and 450° C. The use of a temperature below 250° C. would lead to an excessively long heating time and a temperature above 450° C. would be prejudicial to obtaining a high planar magnetic anisotropy in the upper part of the ferrimagnetic garnet layer. Thus, an excessive temperature would lead to the reinstatement of the defects produced in said layer during ion implantation.

The heating time is a function of the heating temperature. Thus, the higher the heating temperature, the shorter the heating time.

The heating of the structure in the presence of the reducing agent can be carried out in one or more stages.

The reduction of the implanted part leads to a considerable variation in the magnetic anisotropy, which leads to the formation of a planar magnetization layer in said implanted part. This planar magnetization layer is more particularly used for stabilizing underlying bubbles.

The following example of the inventive process will illustrate the significant increase obtained in the magnetic anisotropy of that part of the implanted ferrimagnetic layer containing non-implanted propagation patterns of the magnetic bubbles.

Following the implantation of neon ions at a dose of $10^{15}$ atoms/cm$^2$ and an energy of 200 keV in a ferrimagnetic garnet layer of $(YSmLuCa)_3\,(FeGe)_5\,O_{12}$, the anisotropy variation between the new ferrimagnetic material and the implanted ferrimagnetic material was determined by measuring the variation in the anisotropy magnetic field$\Delta H_K$ (in A/m). This was followed by a first heating of the structure in the presence of hydrogen for 28 hours at a temperature of 292° C. in a furnace, the hydrogen pressure being approximately 1 atm. ($10^{15}$ Pa). This was followed by a second measurement of the variation in the magnetic anisotropy between the anisotropy of the implanted, annealed magnetic layer and the anisotropy of the new layer.

This was followed by a second heating of the structure in the presence of hydrogen at a temperature of 292° C. for 95 hours, the hydrogen pressure being approximately 1 atm. This was followed by once again measuring the variation in the magnetic anisotropy field between the anisotropy field of the implanted new ferrimagnetic layer and the anisotropy field of the thus treated layer.

This was followed by a third heating under vacuum at a temperature of 200° C. for approximately 1 hour. Once again the magnetic anisotropy field variation was measured and, determined by nuclear reactions with the boron ions, the quantity of hydrogen able to diffuse into the implanted upper layer.

The results of the different measurements are given in the following table. As shown therein, the magnetic anisotropy of the implanted ferrimagnetic layer has more than doubled as a result of the inventive process.

This anisotropy variation can only be due to a reduction in the surface portion of the implanted layer leading to a migration towards the surface of said layer of the oxygen entering into the composition of said layer, the oxygen resulting from the defects caused during ion implantation. Oxygen migration towards the surface of the implanted magnetic layer leads to an oxygen depletion thereof, causing a reduction of $Fe^{3+}$ions into $Fe^{2+}$ions responsible for magnetic anisotropy.

The third vacuum heating has the effect of showing that the increase in the magnetic anisotropy is not due to hydrogen diffusion into the upper ferrimagnetic layer. Thus, if this was the case, there would have been a reduction in the magnetic anisotropy variation during vacuum annealing. As hydrogen is very mobile at this temperature, it would partly have passed out of the structure. However, there is in fact an increase in the magnetic anisotropy variation, which would make it appear that there was still an oxygen migration towards the surface of the implanted layer.

It should be noted that the part of the non-implanted ferrimagnetic layer containing the magnetic bubbles was not modified by the stages of heating the structure in the presence of a reducing agent.

TABLE

| | Before heating | First heating under $H_2$ | Second heating under $H_2$ | Third heating in vacuo |
|---|---|---|---|---|
| $\Delta H_K$ in A/m | $125 \cdot 10^3$ | $152 \cdot 10^3$ | $347 \cdot 10^3$ | $361 \cdot 10^3$ |
| Hydrogen | None | Little | Little | Little |

What is claimed is:

1. A process for producing a ferrimagnetic garnet layer, which has a high magnetic anisotropy, on an amagnetic substrate, comprising the steps of:

forming at least one ferrimagnetic garnet layer by epitaxial growth on said amagnetic substrate;

implanting a high dose of ions derived from a gaseous element in said ferrimagnetic garnet layer which does not make the implanted portion of the ferrimagnetic layer amorphous, in order to produce defects within the garnet layer; and heating the entity in the presence of a reducing agent to a temperature ranging from 250° to 292° C.

2. The process of claim 1, wherein said reducing agent is a gas.

3. The process of claim 2, wherein said reducing agent is hydrogen sulfide, hydrogen phosphide, hydrogen antimonide, hydrogen arsenide or hydrogen.

4. The process of claim 3, wherein said reducing agent is hydrogen.

5. The process of claim 1, wherein said implanted ions are hydrogen ions, neon ions, nitrogen ions, oxygen ions or argon ions.

6. The process of claim 5, wherein said implanted ions are neon ions.

7. The process of claim 1, wherein the thickness of the ion implanted layer in said ferrimagnetic garnet layer ranges up to about 300 nm.

8. The process of claim 1, wherein said ferrimagnetic garnet is an oxide of the formula: $(YSmLuCa)_3(FeGe)_5O_{12}$.

9. The process of claim 1, wherein said amagnetic substrate is gadolinium gallate of the formula: $Gd_3Ga_5O_{12}$.

10. The process of claim 1, wherein said ferrimagnetic garnet layer has a thickness of about 1000 nm.

11. A process for producing a ferrimagnetic garnet layer which has a high planar magnetic anisotropy on an amagnetic substrate, which process is applied to the production of a bubble store with non-implanted propagation patterns, comprising the steps of:

forming a ferrimagnetic garnet layer by epitaxial growth on said amagnetic substrate;

implanting a high dose of ions derived from a gaseous elements in the upper portion of said ferrimagnetic garnet layer which portion is not rendered amorphous by said implantation, in order to produce defects in said portion and to form the propagation patterns desired; and heating the entity in the presence of a reducing agent to a temperature between 250° and 292° C.

* * * * *